(12) United States Patent
Bai

(10) Patent No.: US 11,613,503 B2
(45) Date of Patent: Mar. 28, 2023

(54) ELECTRO-CERAMIC MATERIAL COMPONENT, ITS MANUFACTURING METHOD AND METHOD OF CONVERTING ENERGY

(71) Applicant: OULUN YLIOPISTO, Oulu (FI)

(72) Inventor: Yang Bai, Oulu (FI)

(73) Assignee: OULUN YLIOPISTO, Oulu (FI)

( * ) Notice: Subject to any disclaimer, the term of this patent is extended or adjusted under 35 U.S.C. 154(b) by 0 days.

(21) Appl. No.: 17/633,322

(22) PCT Filed: Dec. 1, 2020

(86) PCT No.: PCT/FI2020/050810
§ 371 (c)(1),
(2) Date: Feb. 7, 2022

(87) PCT Pub. No.: WO2021/111035
PCT Pub. Date: Jun. 10, 2021

(65) Prior Publication Data
US 2022/0267219 A1 Aug. 25, 2022

(30) Foreign Application Priority Data
Dec. 2, 2019 (FI) ..................................... 20196042

(51) Int. Cl.
*C04B 35/495* (2006.01)
*C04B 35/645* (2006.01)
(Continued)

(52) U.S. Cl.
CPC .......... *C04B 35/645* (2013.01); *C04B 35/495* (2013.01); *C04B 35/62685* (2013.01);
(Continued)

(58) Field of Classification Search
CPC . H01L 41/1873; C04B 35/645; C04B 35/495; C04B 35/62685
See application file for complete search history.

(56) References Cited

U.S. PATENT DOCUMENTS

| 10,749,056 B2* | 8/2020 | Spanier ............. C04B 35/62675 |
| 2004/0058797 A1* | 3/2004 | Nonoyama ......... H01L 41/1873 501/134 |

(Continued)

OTHER PUBLICATIONS

Bai et al., A Game Changer: A Multifunctional Perovskite Exhibiting Giant Ferroelectricity and Narrow Bandgap with Potential Application in a Truly Monolithic Multienergy Harvester or Sensor, Advanced Materials Wiley-VCH, Jun. 6, 2017, vol. 29, 7 pages.

(Continued)

*Primary Examiner* — Matthew E. Hoban
(74) *Attorney, Agent, or Firm* — Nixon & Vanderhye PC

(57) ABSTRACT

The ceramic material element includes a main phase of orthorhombic perovskite-structure and a secondary phase due to a heat treatment within 700° C. to 850° C. for a first period followed by a second period within 1140° C. to 1170° C., from a mixture of materials A1, A2, A3, A4 and A5 excluding lead, the materials A1, A2, A3, A4 and A5 having molar ratios R1, R2, R3, R4 and R5, respectively, where the material A1 comprises potassium, the material A2 comprises sodium, the material A3 comprises barium, the material A4 comprises niobium, and the material A5 comprises nickel, and the molar ratio R1 is in a range 0.29-0.32, the molar ratio R2 is in a range 0.20-0.23, the molecular ratio R3 is in a range 0.01-0.02, the molar ratio R4 is in a range 0.54-0.55, and the molar ratio R5 is in a range 0.006-0.011, while a relative ratio of R1/R2 is in the range 1.24-1.52, and a relative ratio of R4/R2 is in the range 2.32-2.62. The ceramic material element converts optical radiation energy and mechanical vibration energy into electric energy.

15 Claims, 7 Drawing Sheets

(51) Int. Cl.
*C04B 35/626* (2006.01)
*H01L 41/187* (2006.01)
*H01L 41/43* (2013.01)

(52) U.S. Cl.
CPC .......... *H01L 41/1873* (2013.01); *H01L 41/43* (2013.01); *C04B 2235/3203* (2013.01); *C04B 2235/3215* (2013.01); *C04B 2235/3251* (2013.01); *C04B 2235/3262* (2013.01); *C04B 2235/3279* (2013.01); *C04B 2235/3281* (2013.01); *C04B 2235/3294* (2013.01); *C04B 2235/661* (2013.01); *C04B 2235/768* (2013.01); *C04B 2235/80* (2013.01)

(56) References Cited

U.S. PATENT DOCUMENTS

| | | |
|---|---|---|
| 2005/0006618 A1 | 1/2005 | Nanao et al. |
| 2013/0104969 A1* | 5/2013 | Rappe .................. H01L 31/072 136/255 |
| 2017/0141293 A1 | 5/2017 | Kozuka et al. |
| 2017/0330983 A1* | 11/2017 | Davies ................ C01G 33/006 |
| 2018/0123019 A1* | 5/2018 | Miura .................. B41J 2/14233 |
| 2019/0003077 A1* | 1/2019 | Fratello .................. C30B 29/22 |

OTHER PUBLICATIONS

Bai et al., Multi-functional perovskites—an investigation of compositional and processing influence on microstructure, dielectric and ferroelectric properties, The European Physical Journal—Special Topics Springer, Aug. 23, 2019, vol. 228, pp. 1555-1573.

Bai et al., "Energy Harvesting Research: The Road from Single Source to Multisource," Advanced Materials Wiley-VCH, Jul. 7, 2018, vol. 30, 1707271.

Bai et al., A Single Material Multi Source Energy Harvester, Multifunctional Sensor, and Integrated Harvester-Sensor System—Demonstration of Concept, Energy Technology, Jul. 16, 2020, 12 pages.

International Search Report for PCT/FI2020/050810 dated Mar. 4, 2021, 4 pages.

FI Search Report for FI20196042 dated Jun. 10, 2020, 2 pages.

Examination Report dated Jul. 28, 2021 in corresponding Application No. GB2108204.5, 4 pages.

Intention to Grant dated Dec. 22, 2022 in corresponding Application No. GB2108204.5, 2 pages.

\* cited by examiner

ELECTRO-CERAMIC MATERIAL COMPONENT, ITS MANUFACTURING METHOD AND METHOD OF CONVERTING ENERGY

This application is the U.S. national phase of International Application No. PCT/FI2020/050810 filed Dec. 1, 2020 which designated the U.S. and claims priority to FI Patent Application No. 20196042 filed Dec. 2, 2019, the entire contents of each of which are hereby incorporated by reference.

FIELD

The invention relates to an electro-ceramic material component, its manufacturing method and a method of converting energy.

BACKGROUND

A conversion between electricity and the following three: solar, thermal and kinetic energy, requires a combination of a solar cell device (optical sensor), a thermal generator device (thermal sensor) and a piezoelectric (mechanical sensor) device which results in a large, cumbersome and complex structure. Hence, there is a need to improve the conversion.

BRIEF DESCRIPTION

The present invention seeks to provide an improvement in the energy conversion.

The invention is defined by the independent claims. Embodiments are defined in the dependent claims.

LIST OF DRAWINGS

Example embodiments of the present invention are described below, by way of example only, with reference to the accompanying drawings, in which FIG. 1 illustrates an example of an apparatus for manufacturing the ceramic material;

DESCRIPTION OF EMBODIMENTS

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. The connections shown in the Figures may refer to logical or physical connections. It is apparent to a person skilled in the art that the described apparatus may also comprise other functions and structures than those described in Figures and text. It should be appreciated that details of some functions, structures, and the signalling used for measurement and/or conversion are irrelevant to the actual invention. Therefore, they need not be discussed in more detail here.

There is a need to simplify the structure of a component for improving the energy conversion capability of the component.

What is explained below relates to multi-functional, opto-electronic, photo-ferroelectric and multi-source energy conversion materials and components which may be used for sensing or for other energy conversion, for example. As an example, the materials and a component utilizing the materials may be used in energy harvesting devices. The problem of the prior art is based on the fact that one has to physically combine the solar cells (optical sensor), thermal generators (thermal sensor) and piezoelectric (mechanical sensor) devices in the complex structure of a hybrid energy converter in order to simultaneously convert or detect solar (optical radiation, in general), thermal and kinetic energy/signals into electricity. Now a component with a material element common to a plurality of energy forms is needed to complete the three tasks. This will save plenty of space for other components in smart devices and wireless sensor networks, for example.

Persons skilled in the art may add other components without increasing the entire size of the device. In addition, fabrication and engineering of multi-source energy converters may be simplified largely.

Figure 1:
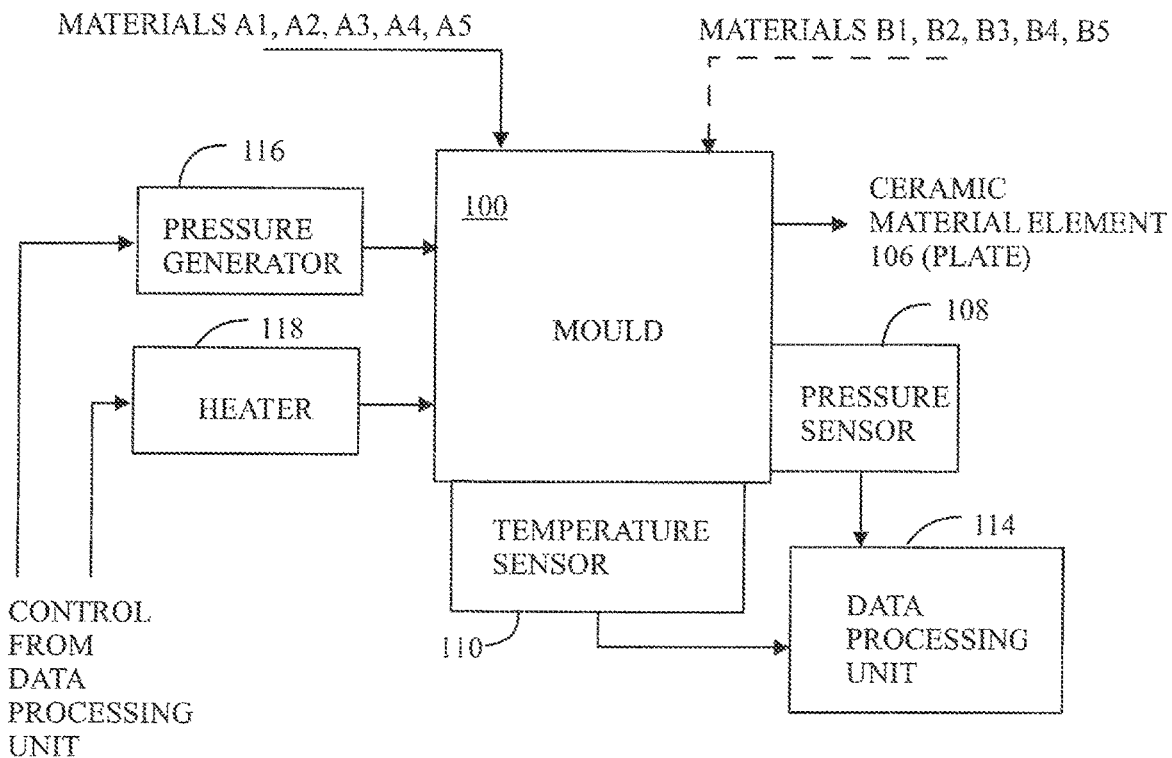

FIG. 1 illustrates an example of manufacture of a ceramic material element 106 for an electrical component. The ceramic material element 106 may be made in a mold 100 by forming a mixture of materials A1, A2, A3, A4 and A5, where the material A1 comprises potassium, the material A2 comprises either sodium, the material A3 comprises barium, the material A4 comprises niobium, and the material A5 comprises nickel. The materials A1, A2, A3, A4 and A5 have molar ratios R1, R2, R3, R4 and R5, respectively. The molar ratio R1 is in a range 0.29-0.32, the molar ratio R2 is in a range 0.20-0.23, the molecular ratio R3 is in a range 0.01-0.02, the molar ratio R4 is in a range 0.54-0.55, and the molar ratio R5 is in a range 0.006-0.011, while a relative ratio of R1/R2 is in the range 1.24-1.52, and a relative ratio of R4/R2 is in the range 2.32-2. These values apply to the final product.

Irrespective of the process type or route, said mixture is exposed to a heat treatment, which has a temperature within about 700° C. to 850° C. for a first period. After the first period, the mixture is exposed to a temperature within about 1140° C. to 1170° C. for a second period in order to form the ceramic material element 106. The first period and the second period may be predetermined periods. The first period may last for about one minute to hours, for example. In an embodiment, a duration of the first period is about one minute. The second period may last for about 1 h to 3 h, for example. The process conditions such as the heat treatment causes formation of aggregates of the materials without particularly inducing chemical reactions. The process conditions namely cause calcination of the materials which results in the formation of the ceramic material element 106.

After the process has completed, the ceramic material element 106 includes a main phase of orthorhombic perovskite-structure and a secondary phase, which, in turn, is a result of the heat treatment and the defined stoichiometry. The material of the ceramic material element 106 has a general chemical composition $(K_xNa_yBa_z)(Nb_\alpha Ni_\beta)O_{3-\delta}$ (KNBNNO). However, the optimum composition achieved the defined process steps includes both the main phase of the orthorhombic perovskite-structure $(K_xNa_yBa_z)(Nb_\alpha Ni_\beta)O_{3-\delta}$ and at least one of the secondary phases of $K_\varphi Nb_\psi O_\omega$, such as tetragonal, cubic or the like.

The ceramic material element 106 may be made without lead which is an advantage from an environmental point of view. The ceramic material element 106 made in this manner is capable of converting both mechanical energy and optical energy to electrical energy. In an embodiment, the ceramic material element 106 manufactured in this manner may also be capable of converting mechanical energy, thermal energy and optical energy to electrical energy. Pressure is considered be a form of mechanical vibration energy.

In an embodiment, the materials A1, A2, A3, A4 and A5, which exclude lead, may be in a form of powder. In an embodiment, the materials A1, A2, A3, A4 and A5 may be in a wet form allowing a hydrothermal process, a sol-gel process or the like. Also a nanotechnological process may be utilized.

A person skilled in the art is familiar with manufacturing technologies, per se, and knows how process ceramic composites. In order to achieve the capability to convert said two or three energy forms into electric energy or vice versa, or any energy conversion therebetween, an optimized stoichiometry, such as that described in this document, should be used. The stoichiometry optimizes the comprehensive properties of the ceramic material element 106.

In an embodiment, pressure ranging between about 30 MPa and 60 MPa may be applied to said mixture during the exposure to the first period of the heat treatment. During the second period of the heat treatment NTP condition may be used (NTP=Normal Temperature and Pressure).

In an embodiment, the mixture may be formed, in addition to the materials A1, A2, A3, A4 and A5, using at least one of the following additional materials: B1, B2, B3, B4 and B5, where material B1 comprises lithium (Li), material B2 comprises manganese (Mn), material B3 comprises tantalum (Ta), B4 comprises antimony (Sb), and B5 comprises copper (Cu) without limiting to these. A person skilled in the art may use also replace any of the additional materials with some other material that he/she finds suitable for the ceramic material element 106. A person skilled in the art may use also add some material not mentioned in this list as one of the additional materials if he/she finds such material suitable for the ceramic material element 106.

In an embodiment, the material B1 may comprise lithium oxide and/or lithium carbon oxide, the material B2 may comprise manganese oxide and/or manganese carbon oxide, the material B3 may comprise tantalum oxide and/or tantalum carbon oxide, the material B4 may comprise antimony oxide and/or antimony carbon oxide, and the material B5 may comprise copper oxide and/or copper carbon oxide. Here the term "oxide" refers to any degree of oxidation i.e. to any oxidation state.

In an embodiment, the mixture may be formed by mixing the materials B1, B2, B3, B4 and B5 in a powder form with the materials A1, A2, A3, A4 and A5. A diameter of particles of the materials B1, B2, B3, B4 and B5 may vary between 50 nm to 5 µm, for example In an embodiment, at least one of the materials B1, B2, B3, B4 and B5 may be in a flowable state. The mixture may then be formed by mixing the materials B1, B2, B3, B4 and B5 with the materials A1, A2, A3, A4 and A5 in a wet form.

In an embodiment, the material A1 may comprise potassium oxide and/or potassium carbon oxide, the material A2 may comprise sodium oxide, sodium carbon oxide, potassium oxide and/or potassium carbon oxide, the material A3 may comprise barium oxide and/or barium carbon oxide, the material A4 may comprise niobium oxide and/or niobium carbon oxide, and the material A5 may comprise nickel oxide and/or nickel carbon oxide. Here the chemical valence is +1 for A1, +1 for A2, +2 for A3, +5 for A4 and +2 for A5. The ceramic material 106 may thus be synthesized from raw reactants of $K_2CO_3$, $Na_2CO_3$, $BaCO_3$, $Nb_2O_5$ and NiO, for example.

In an embodiment, the mixture may be formed by mixing the materials A1, A2, A3, A4 and A5 in a powder form. A diameter of particles of the materials A1, A2, A3, A4 and A5 may vary between about 50 nm to 5 µm, for example.

In an embodiment, at least one of the materials A1, A2, A3, A4 and A5 may be in a flowable state. The mixture may then be formed by mixing the materials A1, A2, A3, A4 and A5 in a wet form.

In an embodiment examples of which are illustrated in FIGS. 2A, 2B, 3A, 3B, the ceramic material element 106 may be formed in form of plate 210. The plate 210 may be like a sheet, for example. The plate 210 may have electrodes 202, 204 on opposite sides of the element 106.

At least one of the electrodes 202, 204 may be transparent to the optical radiation that is converted to other energy form or to which some other energy is converted. An ITO (Indium Tin Oxide) electrode is transparent, for example, and that may be utilized but the electrodes 202, 204 are not limited to the ITO material. Another of the electrodes 202, 204 may be a metal electrode. The metal electrode may comprise gold (Au), silver (Ag), copper (Cu), and/or aluminum (Al), for example.

The ceramic material element 106 may be fabricated via thick-film or thin-film technologies, including but not limited to screen-printing, tape-casting, doctor-blading, sputtering, sol-gel, direct writing, 3D-printing and PLD (Pulsed Laser Deposition).

Correspondingly, electrodes of the ceramic material element 106 may be fabricated via thick-film or thin-film technologies, including but not limited to screen-printing, tape-casting, doctor-blading, sputtering, sol-gel, direct writing, 3D-printing and PLD (Pulsed Laser Deposition).

The ceramic material element 106 may receive and/or output electric energy through the electrodes 202, 204. That is, the ceramic material element 106 may generate an electric potential difference between the electrodes 202, 204, which are attached to the ceramic material element 106 and which do not have a galvanic contact with each other i.e. not short circuited to each other, when the ceramic material element 106 receives mechanical vibrational energy, optical radiation energy and/or thermal energy. In an embodiment, the electric energy may be detected at the electrodes 202, 204 i.e. the electric energy may carry information. In an embodiment, the electric energy may be transferred from the electrodes 202, 204 to perform work in some other device.

In an embodiment, the plate 210 of the ceramic material element 106, which has the electrodes 202, 204, may be attached on a beam 206, which is a supportive structure. Material of the beam 206 can be freely chosen, and the beam 206 may be made of metal, polymer, glass, ceramic, wood, any combination thereof or the like, for example. One end of the beam 106 may be attached to a mechanical vibrational source 212 for converting vibrational energy of the mechanical vibrational source 212 by the element 106 to electric energy. The attachment may be temporal or continuous, and the attachment may be done repeatedly to the same mechanical vibration source 212 or to various mechanical vibration sources 212 if the attachment is temporal at least once. Then the electric energy may be output through the electrodes 202, 204 to any receiving device.

The ceramic material element 106 may cover the entire or only a part of the beam 206.

The free and non-attached end of the beam 206 may have a tip mass 208 made from any material. In an embodiment, the tip mass 208 is made of metal, for example. In an embodiment, the tip mass 208 is made of steel, for example. In an embodiment, the tip mass 208 is made of lead, for example. In an embodiment, the tip mass 208 is made of gold, for example. The tip mass 208 may have an effect on the frequency band of the vibration such that a desired band of vibration may be converted into electric energy or vice versa.

The mechanical vibrational source 212 may comprise a wall, a floor, a ceiling, a window or the like of a building. The mechanical vibrational source 212 may comprise a bridge, a bike, a motorcycle, a car, a bus, a train, a submarine, a boat, an airplane, a spacecraft or any part of them, for example. The mechanical vibrational source 212 may comprise a motor, an engine, or a generator, for example. The mechanical vibrational source 212 may comprise a microphone or a loud speaker, for example. The mechanical vibrational source 212 may comprise human or animal body movement, geographical movement, or earthquake, for example.

Figure 2A:
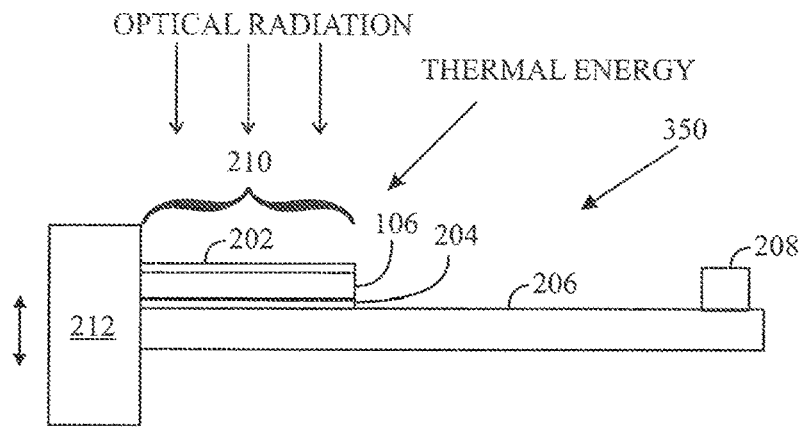
FIGS. 2A and 2B illustrate an example of a cantilever structure of an energy harvesting component.
Figure 2B:
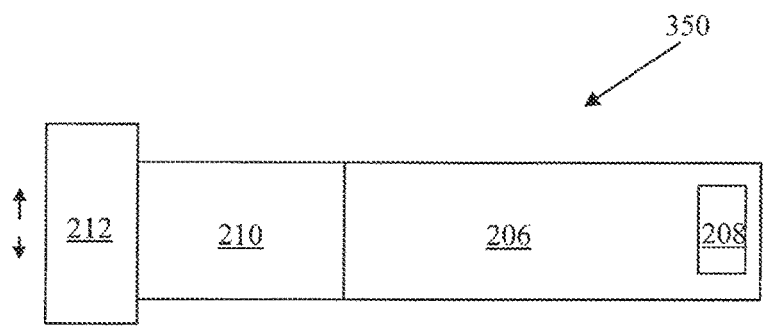

The unimorph layout shown in the FIGS. 2A, 2B may alternatively be a bimorph, i.e. two ceramic material elements 106 are attached on both surfaces of the beam 206. In general, there may be a plurality of the ceramic material elements 106 on one or two sides of the beam 206. The cantilever may then harvest the vibration energy in a conventional cantilever-structured piezoelectric energy harvesting mode. Alternatively or simultaneously, visible and/or UV (UltraViolet) light as a form of optical radiation may be directed on the top of the component 350 and the ceramic material elements 106, and then be harvested via a photovoltaic effect. Alternatively or simultaneously, the component 350 and the ceramic material elements 106 may be subjected to thermal energy as the heat input, and then the thermal energy may be harvested via a pyroelectric effect. Electric signals may be extracted between the top and bottom electrodes 202, 204. Examples of these signals are illustrated in FIGS. 6 to 11. This kind of energy conversion may apply to any embodiment.

Figure 3A:
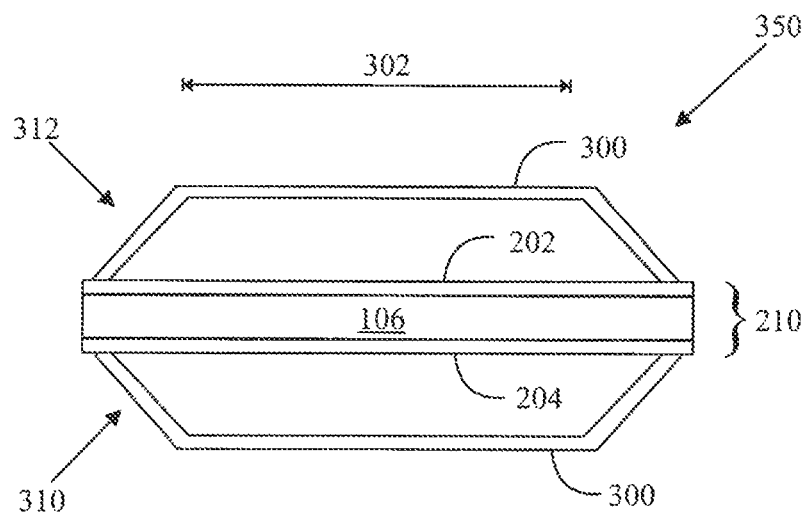
FIGS. 3A and 3B illustrate an example of a cymbal-structured energy harvester.
Figure 3B:
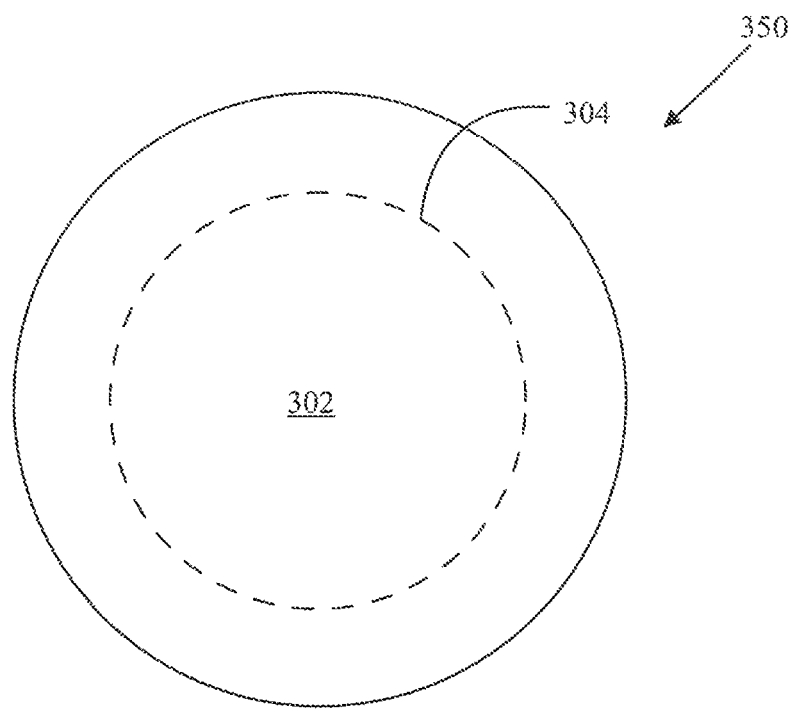

In an embodiment an example of which is illustrated in FIGS. 3A, 3B, a case 300, which is also a supportive structure, and the plate 210 with the element 106 may be attached together. The case 300 is in a physical contact with the plate 210 at or adjacent to a circumference 304 of an area 302 of the plate 210. A part of the case 300 is over the area 304 of the plate 210 in a physically contactless manner on a first side 310 of the plate 210.

The case 300 is in a physical contact with the plate 210 at or adjacent to a circumference 302 of the area 302 of the plate 210. A part of the case 300 is over the area 302 of the plate 210 in a physically contactless manner on a second side 312 of the plate 210. The both sided area 302 may thus be within the case 300, or in other words the case 300 may include the area 302 of both sides. In an embodiment, the case 300 may contain the whole plate 210.

In an embodiment, the case 300 may be transparent to optical radiation on the first side 310 of the plate 210 for receiving and optical radiation and converting energy of the optical radiation to electrical energy.

In an embodiment, the case 300 conducts mechanical vibration to the plate 210 with the element 106 for converting energy of the mechanical vibration to electrical energy.

In an embodiment, the case 300 may be at least partly thermally conductive for allowing the plate 210 with the element 106 receive thermal energy and convert the thermal energy to electrical energy.

The component 350 is illustrated in FIGS. 2A to 3B and comprises the ceramic material element 106. The ceramic material element 106 is formed, without lead, through the heat treatment as already explained above. The ceramic material element 106 is configured to convert optical radiation energy and mechanical vibration energy into electric energy. In an embodiment, the ceramic material element 106 is additionally configured to convert thermal energy to electric energy. These energy conversions are possible because the ceramic material element 106 includes a main phase of orthorhombic perovskite-structure and a secondary phase, which, in turn, is a result of the heat treatment and the defined stoichiometry. The material of the ceramic material element 106 has a general chemical composition $(K_xNa_yBa_z)(Nb_\alpha Ni_\beta)O_{3-\delta}$ (KNBNNO). However, the optimum composition achieved the defined process steps includes both the main phase of the orthorhombic perovskite-structure $(K_x Na_yBa_z)(Nb_\alpha Ni_\beta)O_{3-\delta}$ and at least one of the secondary phases of $K_qNb_\psi O_\omega$, such as tetragonal, cubic or the like.

The component 350 may comprise the plate 210 of the ceramic material element 106, which has electrodes 202, 204 on opposite sides 310, 312 of the element 106. The electrodes 202, 204 are configured to conduct electric energy to and/or from the ceramic material element 106.

In an embodiment, a ceramic material element 106 that has electrodes 202, 204 on two sides 310, 312 of the ceramic material element 106 receives mechanical vibrational energy and optical radiation energy.

The ceramic material element 106 then converts the mechanical vibrational energy and the optical radiation energy to electric energy.

The ceramic material element 106 finally outputs the electric energy through the electrodes 202, 204, the ceramic material element 106 having both a main phase of orthorhombic perovskite-structure and a secondary phase due to the heat treatment.

As shown in FIG. 1, process conditions of the manufacturing process may be measured with at least one sensor 108, 110. The processing conditions may also be adjusted by actuators 116, 118, which are controlled by a data processing unit 114. The data processing unit 114 may receive information on the temperature in the mould 100 from at least one temperature sensor 110. Alternatively or additionally, the data processing unit 114 may receive pressure information on the pressure in the mould 100 from at least one pressure sensor 108. Then the data processing unit 114 may control either or both of the heater 118 and the pressure generator 116 such that one or more desired conditions are achieved in the mould 100 for one or more desired periods of time.

Figure 4A:
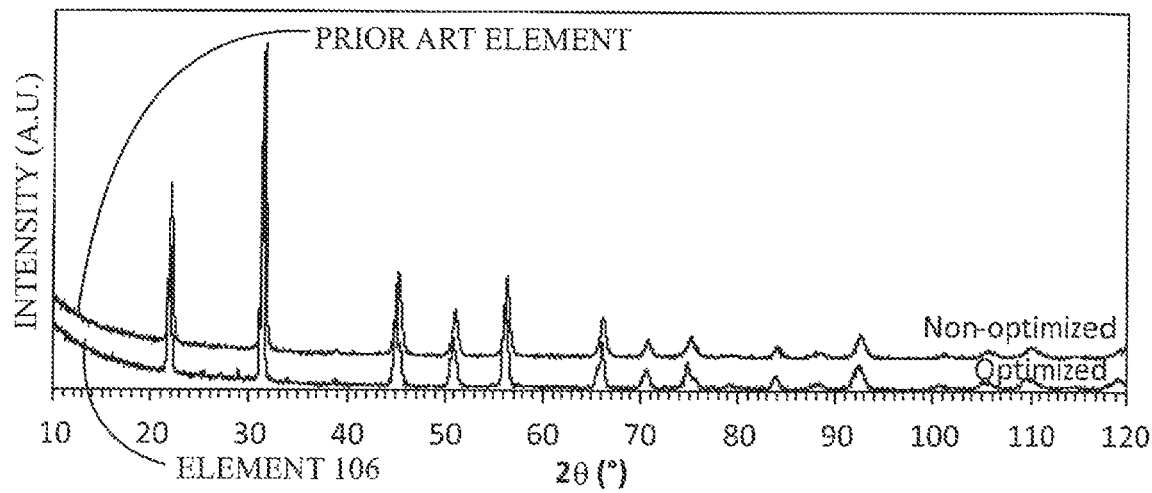
FIGS. 4A to 4C illustrate examples of XRD patterns of the ceramic material.
Figure 4B:
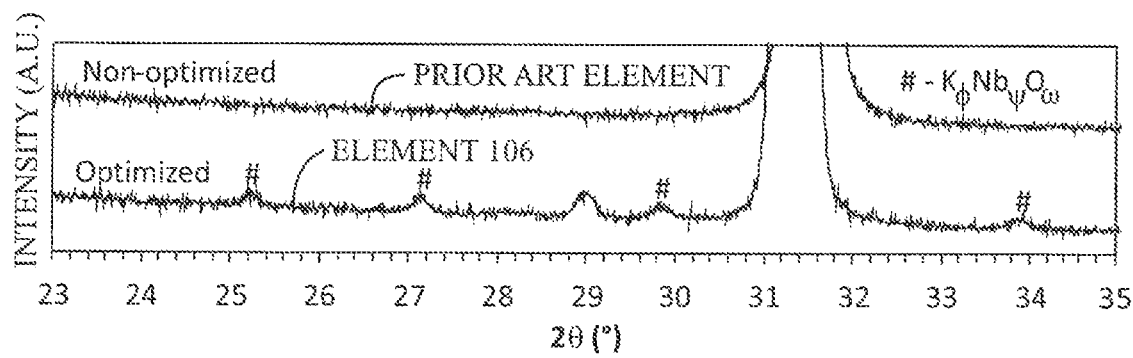
Figure 4C:
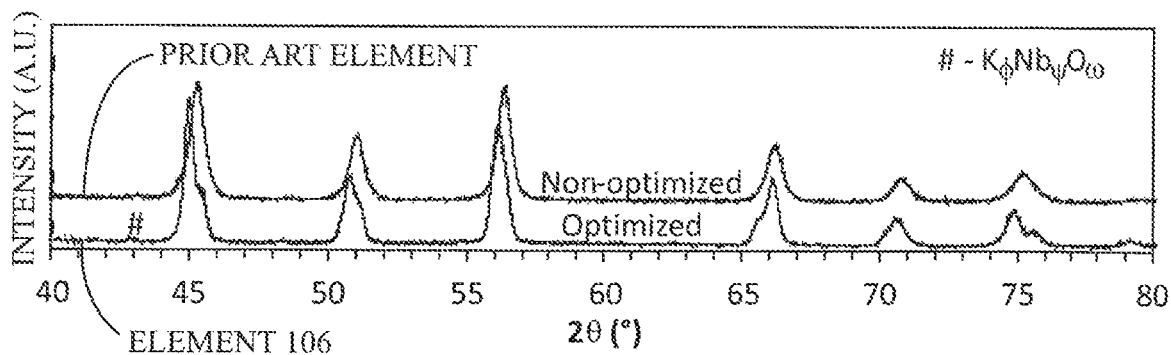

The X-ray diffraction (XRD) patterns of the ceramic material element 106, which is optimized, and an element manufactured from the same materials according to a prior art method, which is however not optimized in the stoichiometrical manner, are shown in FIGS. 4A to 4C. The properties of the optimized and non-optimized compositions are different. Visually the sintered ceramic material of the prior art may be near-transparent with an antique bronze colour, while the ceramic material element 106 is different such that it may be near-opaque with a darker-green (or brown) colour, for example.

Figure 5:
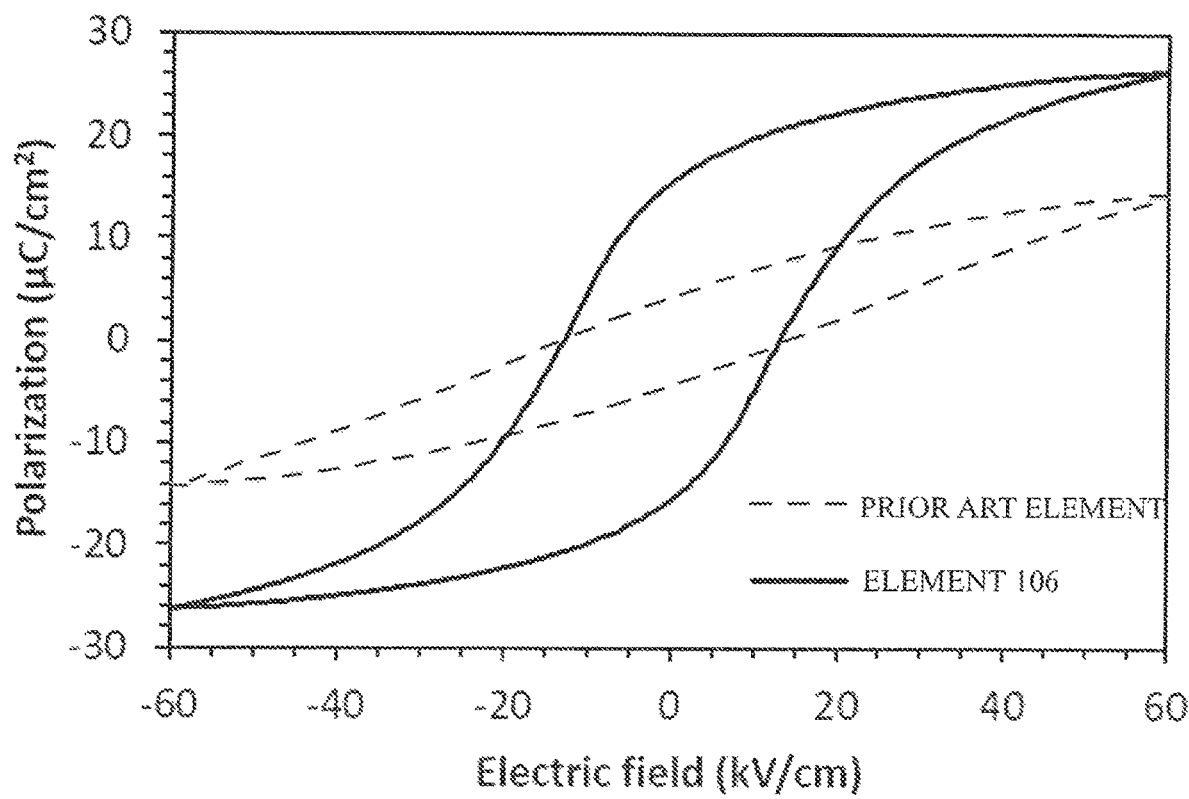
FIG. 5 illustrate an example of ferroelectric hysteresis loops of the ceramic material that is made according what is taught in this document and a ceramic material made according to the prior art.

FIG. 5 illustrates an example of ferroelectric hysteresis loops of a prior art ceramic material element and the ceramic material element 106. Also, the remanent polarization of the prior art element may only be up to 7 $\mu C/cm^2$ while that of the ceramic material element 106 may be larger than 14 $\mu C/cm^2$. The difference will lead to the piezoelectric coefficient PZC of the prior art element and ceramic material element 106 to be <30 pC/N and >80 pC/N, respectively. In addition, the band gaps GB of the ceramic material may be 1.6 eV or even smaller, while those of the prior art element may be 2.5 eV or even higher. Although the prior art element, which is structurally and operationally different from the ceramic material element 106 (see FIGS. 4A to 5) due to a different manufacturing method, is able to simultaneously harvest solar, thermal and kinetic energy via photovoltaic, pyroelectric and piezoelectric effects at least from a theoretical point of view, the conversion efficiency is so low that it is technically and particularly practically unusable. No such a product commercially is available despite the long lasting need. However, the ceramic material element 106 is capable of generating a clearly higher power density than the prior art element, which makes the ceramic material element 106 technically and practically desirable and usable.

FIGS. 6 to 11 illustrate examples of signal input to and output by the ceramic material element 106 when it receives various energy forms. The test is based on a component 350 illustrated in FIGS. 2A, 2B. A 1 MΩ resistor and a high-precision electrometer (current measurement mode) are connected in series with the top and bottom electrodes 202, 204 of the ceramic material element 106. Stainless steel is used as material of the beam 206 with the dimensions of 10 mm×50 mm×100 μm. The dimensions of the ceramic material element 106 are 10 mm×12 mm×100 μm, coated with ITO top electrode and silver (Ag; screen-printed, for example) bottom electrode and attached at a fixed side of the cantilever. A 1.4 g tip mass 208, which may made from lead (Pb), is attached at the free end of the cantilever. The cantilever was mounted on a shaker, which acts as a mechanical vibration source 212, providing the vibration input (12 μm peak-to-peak amplitude at resonant frequency of the cantilever). A 405 nm, 50 mW laser (purple) beam is used as a light source. The heat source is provided by a hot air gun.

Figure 6:
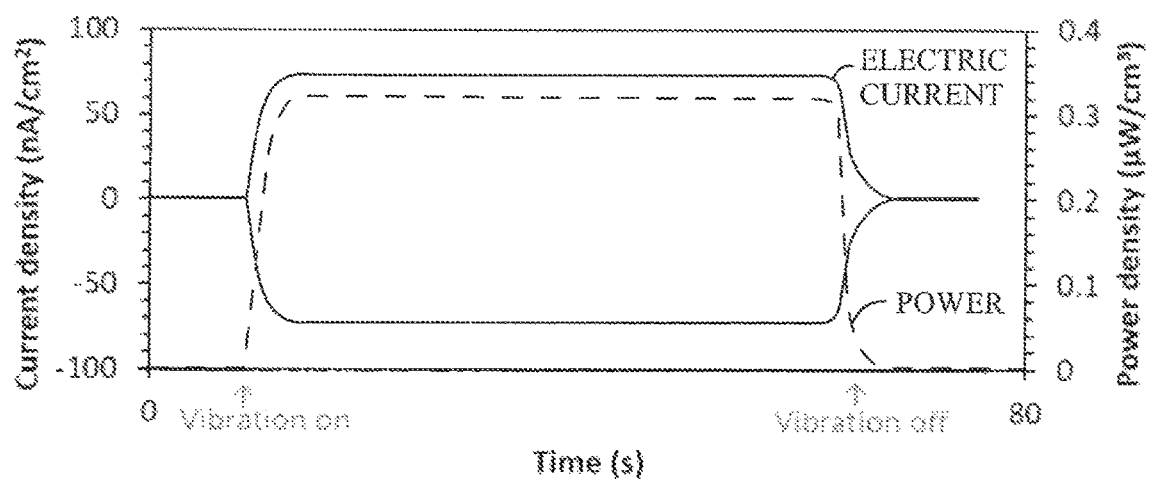
FIGS. 6 to 11 illustrate examples of electric current densities and power densities input to and output by a ceramic material element.

FIG. 6 illustrates an example of the output current and power densities of a cantilever-structured multi-source energy harvester of FIGS. 2A and 2B using the ceramic material element 106. A value of vibration (kinetic) power is in the vertical axis (left), a value of electric current density is in the vertical axis (right), and time in seconds is in the horizontal axis. It can be seen that the mechanical vibrational power, whose envelope curve is shown in FIG. 6, is converted into electric current, as shown with the curve of an envelope of the electric current density.

Figure 7:
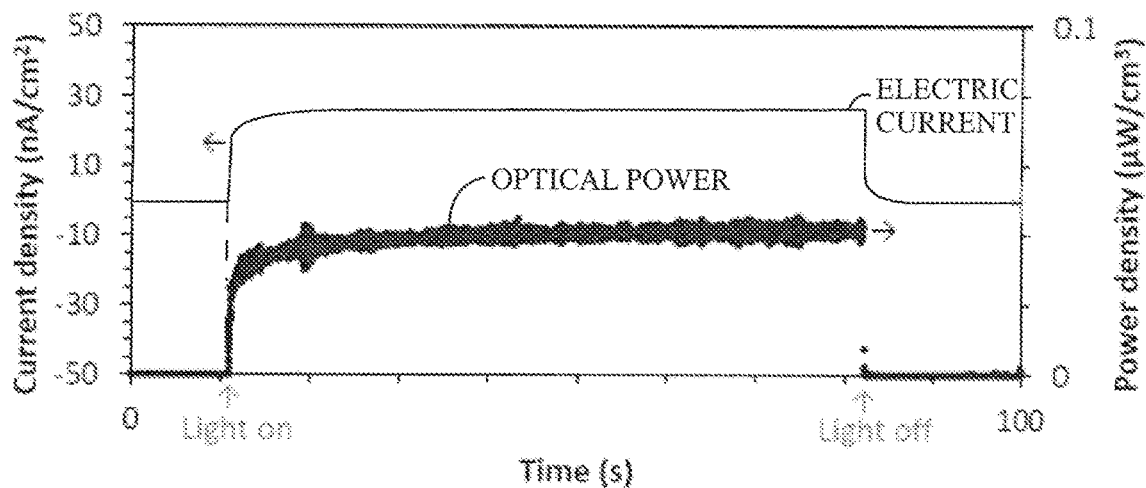

FIG. 7 illustrates an example of the output current and power densities of a cantilever-structured multi-source energy harvester of FIGS. 2A and 2B using the ceramic material element 106. In FIG. 7 the input power is optical radiation. A value of the power of the optical radiation is in the vertical axis (left), a value of electric current density is in the vertical axis (right), and time in seconds is in the horizontal axis. It can be seen that the optical radiation power is converted into electric current.

Figure 8:
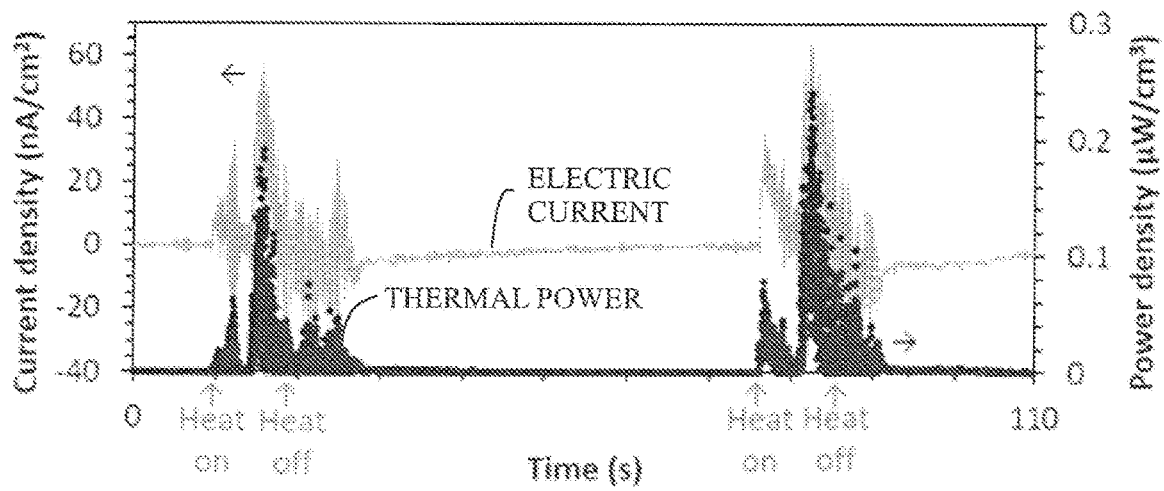

FIG. 8 illustrates an example of the output current and power densities of a cantilever-structured multi-source energy harvester of FIGS. 2A and 2B using the ceramic material element 106. In FIG. 8 the input power is thermal power. A value of the thermal power is in the vertical axis (left), a value of electric current density is in the vertical axis (right), and time in seconds is in the horizontal axis. It can be seen that the thermal power is converted into electric current.

Figure 9:
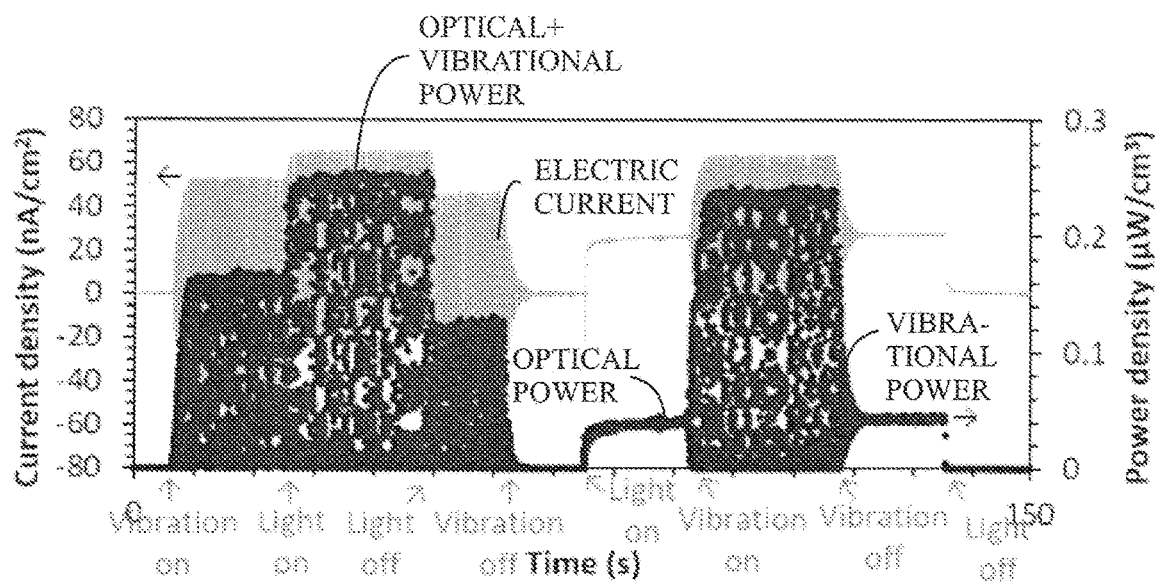

FIG. 9 illustrates an example of the output current and power densities of a cantilever-structured multi-source energy harvester of FIGS. 2A and 2B using the ceramic material element 106. In FIG. 9 the input powers are vibrational power and optical radiation power. A value of the vibrational power and optical radiation power are in the vertical axis (left), a value of electric current density is in the vertical axis (right), and time in seconds is in the horizontal axis. It can be seen that the both the vibrational power and the optical power are simultaneously converted into electric current.

Figure 10:
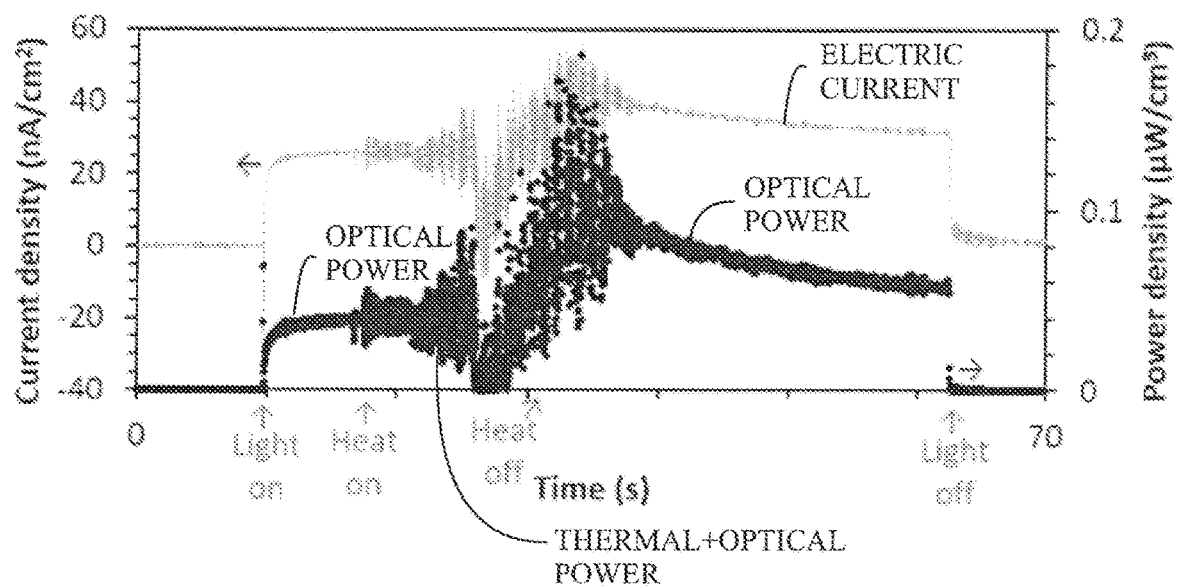

FIG. 10 illustrates an example of the output current and power densities of a cantilever-structured multi-source energy harvester of FIGS. 2A and 2B using the ceramic material element 106. In FIG. 10 the input powers are optical radiation power and thermal power. A value of the optical radiation power and thermal power are in the vertical axis (left), a value of electric current density is in the vertical axis (right), and time in seconds is in the horizontal axis. It can be seen that the both the optical radiation power and the thermal power are simultaneously converted into electric current.

Figure 11:
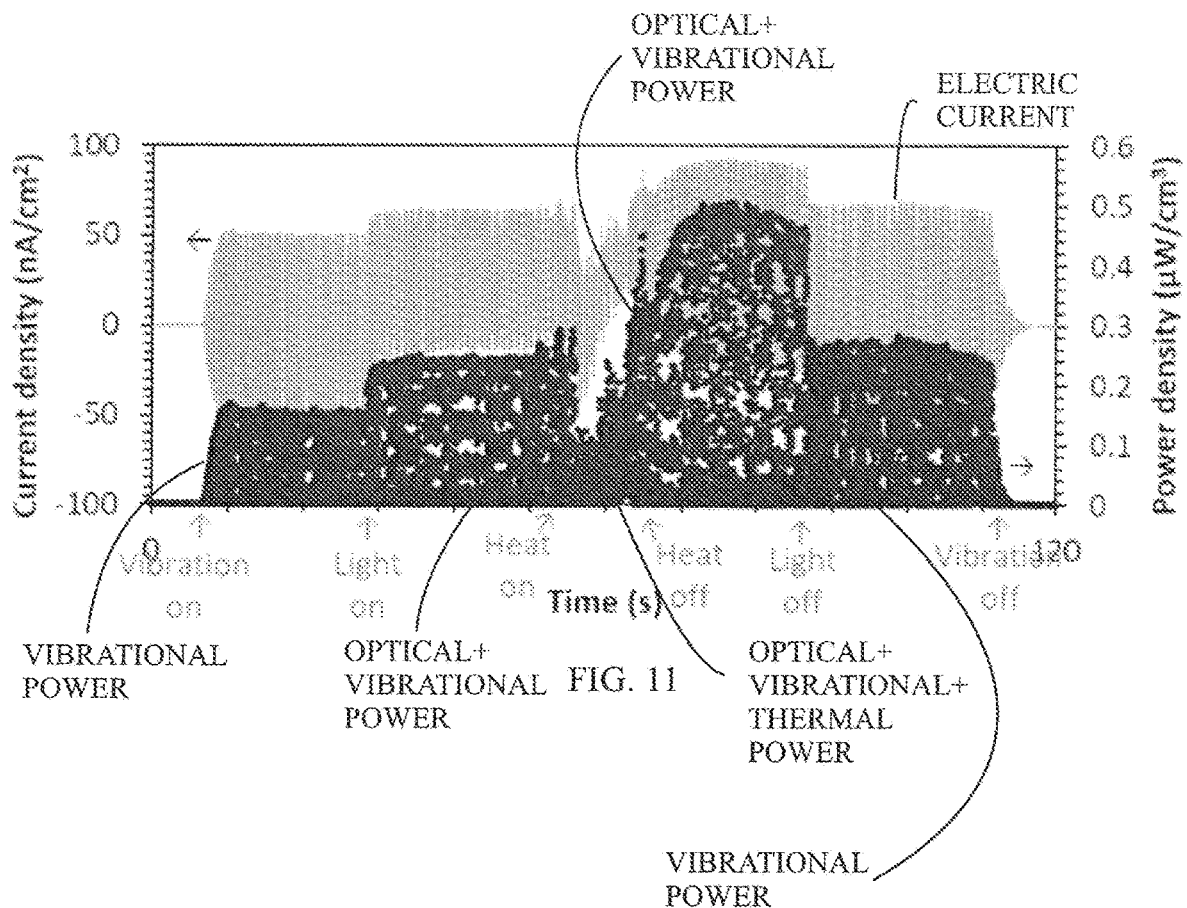

FIG. 11 illustrates an example of the output current and power densities of a cantilever-structured multi-source energy harvester of FIGS. 2A and 2B using the ceramic material element 106. In FIG. 11 the input powers are vibrational power, optical radiation power and thermal power. A value vibrational power, optical radiation power and thermal power are in the vertical axis (left), a value of electric current density is in the vertical axis (right), and time in seconds is in the horizontal axis. It can be seen that the vibrational power, the optical radiation power and the thermal power are simultaneously converted into electric current.

The same ceramic material element 106 is used in all FIGS. 6 to 10.

Figure 12:
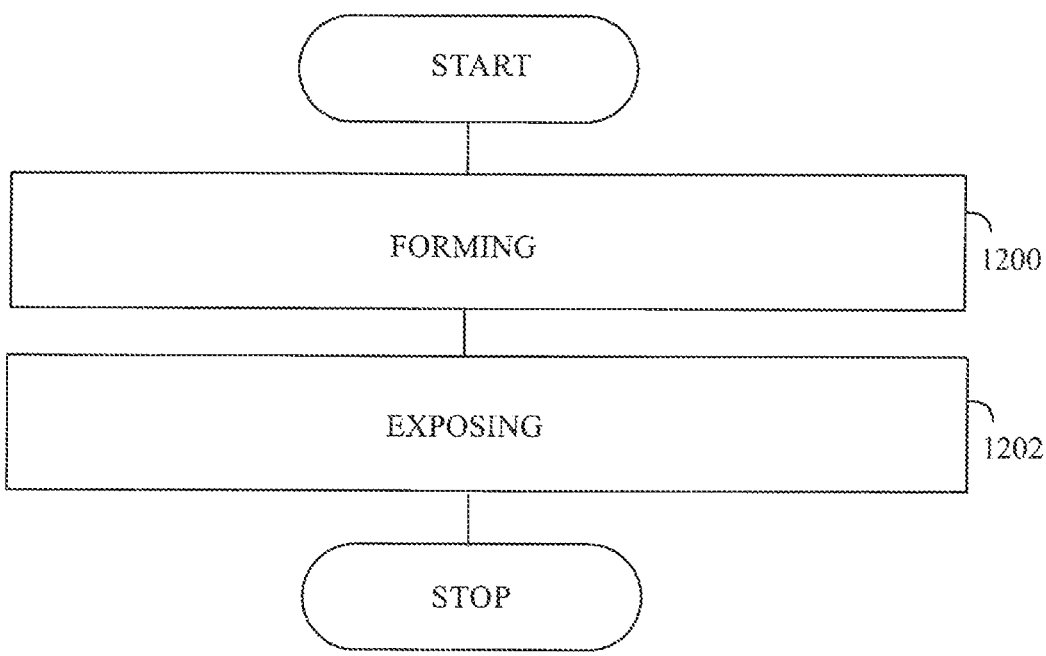
FIG. 12 illustrates an example of a flow chart of the manufacturing method.

FIG. 12 is an example of a flow chart of the manufacturing method. In step 1200, a mixture of materials A1, A2, A3, A4 and A5 excluding lead is formed, the materials A1, A2, A3, A4 and A5 having molar ratios R1, R2, R3, R4 and R5, respectively, where the material A1 comprises potassium, the material A2 comprises sodium, the material A3 comprises barium, the material A4 comprises niobium, and the material A5 comprises nickel. In step 1202, said mixture is exposed to a heat treatment, which has a temperature within about 700° C. to 850° C. for a first period, and thereafter a temperature within about 1140° C. to 1170° C. for a second predefined period in order to form the ceramic material element 106 of the component 350, which converts both mechanical energy and optical energy to electrical energy.

The molar ratio R1 may be in a range about 0.29-0.32, the molar ratio R2 may be in a range about 0.20-0.23, the molecular ratio R3 may be in a range about 0.01-0.02, the molar ratio R4 may be in a range about 0.54-0.55, and the molar ratio R5 may be in a range about 0.006-0.011. Meanwhile, the relative ratio of R1/R2 should be in the range about 1.24-1.52, and the relative ratio of R4/R2 should be in the range about 2.32-2.62. These values apply to the final product.

Figure 13:
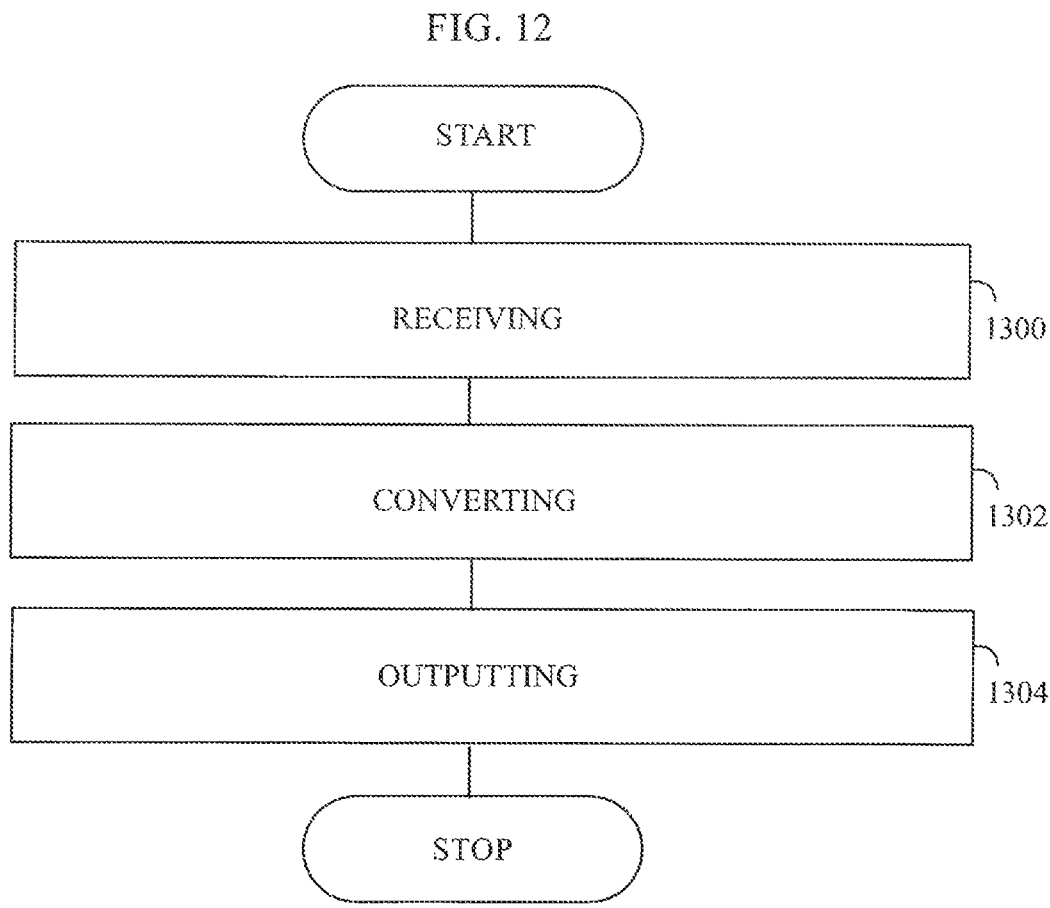
FIG. 13 illustrates of an example of a flow chart of the energy conversion method.

FIG. 13 is an example of a flow chart of the energy conversion method. In step 1300, mechanical vibrational energy and optical radiation energy is received by a ceramic material element 106 that has electrodes 202, 204 on two sides of the ceramic material element 106. Also thermal energy may be received. In step 1302, the mechanical vibrational energy and the optical radiation energy are converted by the ceramic material element 106 to electric energy. Also thermal energy may be converted into electric energy. In step 1304, the electric energy is output through the electrodes 202, 204, the ceramic material element 106 including a main phase of orthorhombic perovskite-structure and a secondary phase formed through a heat treatment, within about 700° C. to 850° C. for a first period followed by a second period within about 1140° C. to 1170° C., from a mixture of materials A1, A2, A3, A4 and A5 excluding lead, the materials A1, A2, A3, A4 and A5 having molar ratios R1, R2, R3, R4 and R5, respectively, where the material A1 comprises potassium, the material A2 comprises sodium, the material A3 comprises barium, the material A4 comprises niobium, and the material A5 comprises nickel, and the molar ratio R1 may be in a range about 0.29-0.32, the molar ratio R2 may be in a range about 0.20-0.23, the molecular ratio R3 may be in a range about 0.01-0.02, the molar ratio R4 may be in a range about 0.54-0.55, and the molar ratio R5 may be in a range about 0.006-0.011, while a relative ratio of R1/R2 should be in the range about 1.24-1.52, and a relative ratio of R4/R2 should be in the range about 2.32-2.62.

What is written above describes the materials, structures, fabrication methods and performances of the ceramic material element 106 and a component utilizing it as an energy converter. The single ceramic material element 106, which is made from only one energy conversion material, is capable of simultaneously converting a plurality of energy forms visible optical radiation, heat, kinetic energy and electricity to at least one energy form. For energy harvesting, optical radiation, heat, kinetic energy can efficiently be converted into electricity. The configurations of conventional multi-source energy converters made from different energy conversion materials can thus be replaced by a component utilizing this simple ceramic material element 106. Because no further simplification beyond this can be made on the structure of the energy conversion component in a multi-source energy converter, the cost, design and engineering of multi-source energy converters may be significantly reduced and simplified with this solution. The applications of this new material may cover the fields of sensing, energy harvesting and optoelectronics, for example.

In this document the concept of using only one energy conversion material to harvest solar or more generally optical radiation, thermal and kinetic energy simultaneously has been revealed for the first time. A material synthesized from raw reactants of $K_2CO_3$, $Na_2CO_3$, $BaCO_3$, $Nb_2O_5$ and NiO, for example, is used as the sole energy conversion component in the multi-source energy harvesters. This material has the chemical composition of $(K_xNa_yBa_z)(Nb_\alpha Ni_\beta)O_{3-\delta}$ (KNBNNO). A proper or optimized stoichiometry is needed to optimize the comprehensive properties of the material, which has been described in this document. With the optimum composition, the material may be made to absorb the entire visible and UV range of the solar spectrum. Meanwhile, it may exhibit remanent polarization RM such that RM>14 μC/cm2 and piezoelectric PZC and pyroelectric coefficients PEC such that PZC>80 pC/N and PEC>120 μC/m2K. It also has a band gap BG such that BG<1.6 eV, which is able to absorb the entire visible range of optical radiation. Incorporated with some supportive structures, e.g. cantilever beams, diaphragm frames, cymbal caps, etc., the fabricated energy harvesters may convert visible and/or UV light, temperature fluctuation and kinetic energy (e.g. vibration, stress/strain, impact, etc.) into electric signals either individually, temporally at alternative moments and/or simultaneously. With the energy conversion material described in this document, the design of the multi-source energy harvesters using only one energy conversion material may become versatile and universal. The relatively complex conventional designs where different energy conversion materials for harvesting different energy sources are compulsory may not be necessary any more. In addition, the energy conversion material in this invention is lead-free, which avoids the use of toxic and hazardous PZT or other lead-based piezoelectric materials of the conventional kinetic energy harvesters.

It is an advantage that a configuration of multi-source energy harvesters may be substantially simplified. Such a simplification may enable a rapid development of the integration of energy harvesters with silicon-based or other emerging circuit boards and chips using the currently available technology, e.g. CMOS (Complementary Metal Oxide Semiconductor) or MEMS (Micro-Electro-Mechanical Systems), etc. This will then bring self-powered sensors and wireless sensor networks a large step closer to practice by eliminating batteries as the power source, which needs frequent and costly maintenance.

However, this demonstration represents only one of many possible occasions. Any other alternative energy harvester using only one energy conversion material and exhibiting a similar multi-source energy harvesting behavior is also considered to be included in the scope of the claims.

It will be obvious to a person skilled in the art that, as technology advances, the inventive concept can be implemented in various ways. The invention and its embodiments are not limited to the example embodiments described above but may vary within the scope of the claims.

The invention claimed is:

1. A method of manufacturing an electrical ceramic composite component, the method comprising forming a mixture of materials comprising A1, A2, A3, A4 and A5 excluding lead, the materials A1, A2, A3, A4 and A5 having molar ratios R1, R2, R3, R4 and R5, respectively, where the material A1 is potassium, the material A2 is sodium, the material A3 is barium, the material A4 is niobium, and the material A5 is nickel; and exposing said mixture to a heat treatment, which has a temperature within 700° C. to 850° C. for a first period, and thereafter a temperature within 1140° C. to 1170° C. for a second predefined period in order to form the ceramic material element of the component including a main phase of orthorhombic perovskite-structure $(K_xNa_yBa_z)(Nb_\alpha Ni_\beta)O_{3-\delta}$ and a secondary phase $K_\varphi Nb_\psi O_\omega$, which has the molar ratio R1 in a range about 0.29-0.32, the molar ratio R2 in a range about 0.20-0.23, the molecular ratio R3 in a range about 0.01-0.02, the molar ratio R4 in a range about 0.54-0.55, and the molar ratio R5 in a range about 0.006-0.011, while the relative ratio of R1/R2 is in the range about 1.24-1.52, and the relative ratio of R4/R2 is in the range about 2.32-2.62 for converting both mechanical energy and optical energy to electrical energy.

2. The method of claim 1, the method further comprising applying pressure 30 MPa to 60 MPa to said mixture.

3. The method of claim 1, the method further comprising forming the mixture in addition to the materials comprising A1, A2, A3, A4 and A5 with at least one of the following materials: B1, B2, B3, B4 and B5, where material B1 comprises lithium (Li), material B2 comprises manganese (Mn), material B3 comprises tantalum (Ta), B4 comprises antimony (Sb), and B5 comprises copper (Cu).

4. The method of claim 3, wherein the material B1 comprises lithium oxide and/or lithium carbon oxide, the material B2 comprises manganese oxide and/or manganese carbon oxide, the material B3 comprises tantalum oxide and/or tantalum carbon oxide, the material B4 comprises antimony oxide and/or antimony carbon oxide, and the material B5 comprises copper oxide and/or copper carbon oxide.

5. The method of claim 3, the method further comprising forming the mixture by mixing the materials B1, B2, B3, B4 and B5 in a powder form with the materials comprising A1, A2, A3, A4 and A5.

6. The method of claim 3, the method further comprising at least one of the materials B1, B2, B3, B4 and B5 being in a flowable state, and forming the mixture by mixing the materials B1, B2, B3, B4 and B5 with the materials comprising A1, A2, A3, A4 and A5 in a wet form.

7. The method of claim 1, wherein the material A1 is provided with potassium oxide and/or potassium carbon oxide, the material A2 is provided with sodium oxide, sodium carbon oxide, potassium oxide and/or potassium carbon oxide, the material A3 is provided with barium oxide and/or barium carbon oxide, the material A4 is provided with niobium oxide and/or niobium carbon oxide, and the material A5 is provided with nickel oxide and/or nickel carbon oxide.

8. The method of claim 1, the method further comprising forming the mixture by mixing the materials comprising A1, A2, A3, A4 and A5 in a powder form.

9. The method of claim 1, the method further comprising at least one of the materials comprising A1, A2, A3, A4 and A5 being in a flowable state, and forming the mixture by mixing the materials comprising A1, A2, A3, A4 and A5 in a wet form.

10. The method of claim 1, the method further comprising forming a plate with the ceramic material element and electrodes by forming electrodes on opposite sides of the ceramic material element, the ceramic material element receiving and/or outputting electric energy through the electrodes.

11. The method of claim 10, the method further comprising attaching the plate with the ceramic material element and the electrodes on a beam, one end of the beam being configured to be attached to a mechanical vibrational source for converting vibrational energy of the mechanical vibrational source by the ceramic material element to electric energy for outputting the electric energy through the electrodes.

12. The method of claim 10, the method further comprising attaching a case and the plate with the ceramic material element together such that the case is in a physical contact with the plate at or adjacent to a circumference of an area of the plate, and the case is over the area of the plate in a physically contactless manner on a first side of the plate;

the case is in a physical contact with the plate at a circumference of the area of the plate, and the case is over the area of the plate in a physically contactless manner on a second side of the plate for having the area of the plate within the case;

the case is transparent to optical radiation on the first side of the plate for converting energy of the optical radiation to electrical energy;

the case conducts mechanical vibration to the plate with the ceramic material element for converting energy of the mechanical vibration to electrical energy;

the case is at least partly thermally conductive for allowing the plate with the ceramic material element to receive thermal energy and to convert the thermal energy to electrical energy.

13. A component comprising a ceramic material element, wherein the ceramic material element including a main phase of orthorhombic perovskite-structure $(K_xNa_yBa_z)(Nb_\alpha Ni_\beta)O_{3-\delta}$ and a secondary phase $K_\varphi Nb_\psi O_\omega$ due to a heat treatment within 700° C. to 850° C. for a first period followed by a second period within 1140° C. to 1170° C., from a mixture of materials comprising A1, A2, A3, A4 and A5 excluding lead, the materials A1, A2, A3, A4 and A5 having molar ratios R1, R2, R3, R4 and R5, respectively, where the material A1 is potassium, the material A2 is sodium, the material A3 is barium, the material A4 is niobium, and the material A5 is nickel, and the molar ratio R1 is in a range 0.29-0.32, the molar ratio R2 is in a range 0.20-0.23, the molecular ratio R3 is in a range 0.01-0.02, the molar ratio R4 is in a range 0.54-0.55, and the molar ratio R5 is in a range 0.006-0.011, while a relative ratio of R1/R2 is in the range 1.24-1.52, and a relative ratio of R4/R2 is in the range 2.32-2.62; and the ceramic material element is configured to convert optical radiation energy and mechanical vibration energy into electric energy.

14. The component of claim 13, wherein the component comprises a plate with the ceramic material element, which is configured to have electrodes on opposite sides of the ceramic material element; and the electrodes are configured to conduct electric energy to and/or from the ceramic material element.

15. A method of converting energy, the method comprising receiving, by a ceramic material element that has electrodes on two sides of the ceramic material element, mechanical vibrational energy and optical radiation energy;

converting, by the ceramic material element, the mechanical vibrational energy and the optical radiation energy to electric energy; and outputting the electric energy through the electrodes, the ceramic material element including a main phase of orthorhombic perovskite-structure $(K_xNa_yBa_z)(Nb_\alpha Ni_\beta)O_{3-\delta}$ and a secondary phase $K_\varphi Nb_\psi O_\omega$ formed through a heat treatment, within 700° C. to 850° C. for a first period followed by a second period within 1140° C. to 1170° C., from a mixture of materials comprising A1, A2, A3, A4 and A5 excluding lead, the materials A1, A2, A3, A4 and A5 having molar ratios R1, R2, R3, R4 and R5, respectively, where the material A1 is potassium, the material A2 is sodium, the material A3 is barium, the material A4 is niobium, and the material A5 is nickel, and the molar ratio R1 is in a range 0.29-0.32, the molar ratio R2 is in a range 0.20-0.23, the molecular ratio R3 is in a range 0.01-0.02, the molar ratio R4 is in a range 0.54-0.55, and the molar ratio R5 is in a range 0.006-0.011, while a relative ratio of R1/R2 is in the range 1.24-1.52, and a relative ratio of R4/R2 is in the range 2.32-2.62.

* * * * *